(12) United States Patent
Watanabe et al.

(10) Patent No.: US 7,733,660 B2
(45) Date of Patent: Jun. 8, 2010

(54) HOUSING STRUCTURE OF ACOUSTIC CONTROLLER

(75) Inventors: Tsutomu Watanabe, Hamamatsu (JP); Hisashi Nagai, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 0 days.

(21) Appl. No.: 12/030,319

(22) Filed: Feb. 13, 2008

(65) Prior Publication Data

US 2008/0197088 A1 Aug. 21, 2008

(30) Foreign Application Priority Data

Feb. 16, 2007 (JP) ............................. 2007-036454

(51) Int. Cl.
*H05K 5/00* (2006.01)
(52) U.S. Cl. ..................................... 361/752; 361/800
(58) Field of Classification Search ................ 361/752, 361/790, 797, 800; 312/223
See application file for complete search history.

(56) References Cited

U.S. PATENT DOCUMENTS

| | | | | |
|---|---|---|---|---|
| 6,438,241 | B1 * | 8/2002 | Silfvast et al. | 381/119 |
| 7,106,580 | B2 * | 9/2006 | Kugimiya et al. | 361/679.22 |
| 7,282,635 | B2 * | 10/2007 | Utsunomiya et al. | 136/244 |
| 7,576,998 | B2 * | 8/2009 | Watanabe et al. | 361/801 |
| 2005/0146996 | A1 * | 7/2005 | Roman | 369/30.27 |
| 2005/0211646 | A1 | 9/2005 | Watanabe | |
| 2005/0259532 | A1 * | 11/2005 | Roman et al. | 369/47.1 |
| 2007/0280489 | A1 * | 12/2007 | Roman et al. | 381/119 |

FOREIGN PATENT DOCUMENTS

JP  2004-111657  4/2004

OTHER PUBLICATIONS

AUDIOLINES.COM. (2009). Numark DM1090X, located at <https://www.audiolines.com/image.php?id=28425&type=D>, last visited Jul. 15, 2009, one page.
AUTOTOYS.COM. (2009). Pyramid PM2008 DJ Mixer, located at <http://www.autotoys.com/x/catalog/Pyramide-PM2008-DJ-Mixer-p-6561.html>, last visited Jul. 15, 2009, six pages.
BAILRIGGFM.COM. (2009). Numark CM 200 Rack Mount DJ Mixer, located at <http://www.bailriggfm.co.uk/photos/main.php?g2_itemId=13964>, last visited Jul. 15, 2009, two pages.
DJDEALS.COM. (2009). Numark AVM02 Video Mixer, located at <http://www.djdeals.com/numarkAVM02.html>, last visited Jul. 15, 2009, seven pages.

(Continued)

*Primary Examiner*—Hung S Bui
(74) *Attorney, Agent, or Firm*—Morrison & Foerster LLP

(57) ABSTRACT

A housing structure of an acoustic controller having a lower case which is lightweight, high in the degree of freedom in shape design, and capable of suppressing a deformation of side walls thereof after being molded. The lower case is integrally formed from resin into a rectangular dish shape having front, rear, left, right, and bottom plates. An upper unit is attached to an open upper part of the lower case. The left and right plates of the lower case have upper parts thereof formed into brim portions protruding outward in the left-to-right direction. Front and rear parts of each brim portion are further protruded outward and formed into flanges that function as mounting portions used for mounting the acoustic controller to a rack.

6 Claims, 8 Drawing Sheets

OTHER PUBLICATIONS

GETINTHEMIX.COM. (2009). Numark 200FX, located at <http://www.getinthemix.co.uk/images/uploaded/mixer_200fx.jpg>, last visited Jul. 15, 2009, one page.

INFINITEELECTRONIX.COM. (2009). Gemini Pro DJ PDM-02 Professional 4-Channel Rack-Mount DJ Mixer with Sound Effects, located at <http://www.infiniteelectronix.com/index.asp?PageAction=VIEWPROD&ProdID=2532>, last visited Jul. 15, 2009, two pages.

SALESTORES.COM. (2009). Pioneer DJM-3000 Professional Rack Mount DJ Mixer with 4 Channel, Onboard Fader, located at <http://salestores.com/pionee123.html>, last visited Jul. 15, 2009, four pages.

SONICSTATE>COM. (2009). NAMM06: Audio/Video Mixer With Effects from Numark, located at <http://www.sonicstate.com/news/2006/01/22/namm06-audiovideo-mixer-with-effects-from...>, last visited Jul. 15, 2009, two pages.

SYNTHTOPIA.COM. (2009). Numark Introduces Three New Lines of DJ Mixers, located at <http://www.synthotiopia.com/content/2008/06/21/numark-introduces-three-new-lines-of-dj-...>, last visited Jul. 15, 2009, 10 pages.

WOODBRASS.COM. (2009). Numark C3FX Mixer, located at <http://www.woodbrass.com/images/woodbrass/NUMARK+C3FX+MIXER.JPG>, last visited Jul. 15, 2009.

* cited by examiner

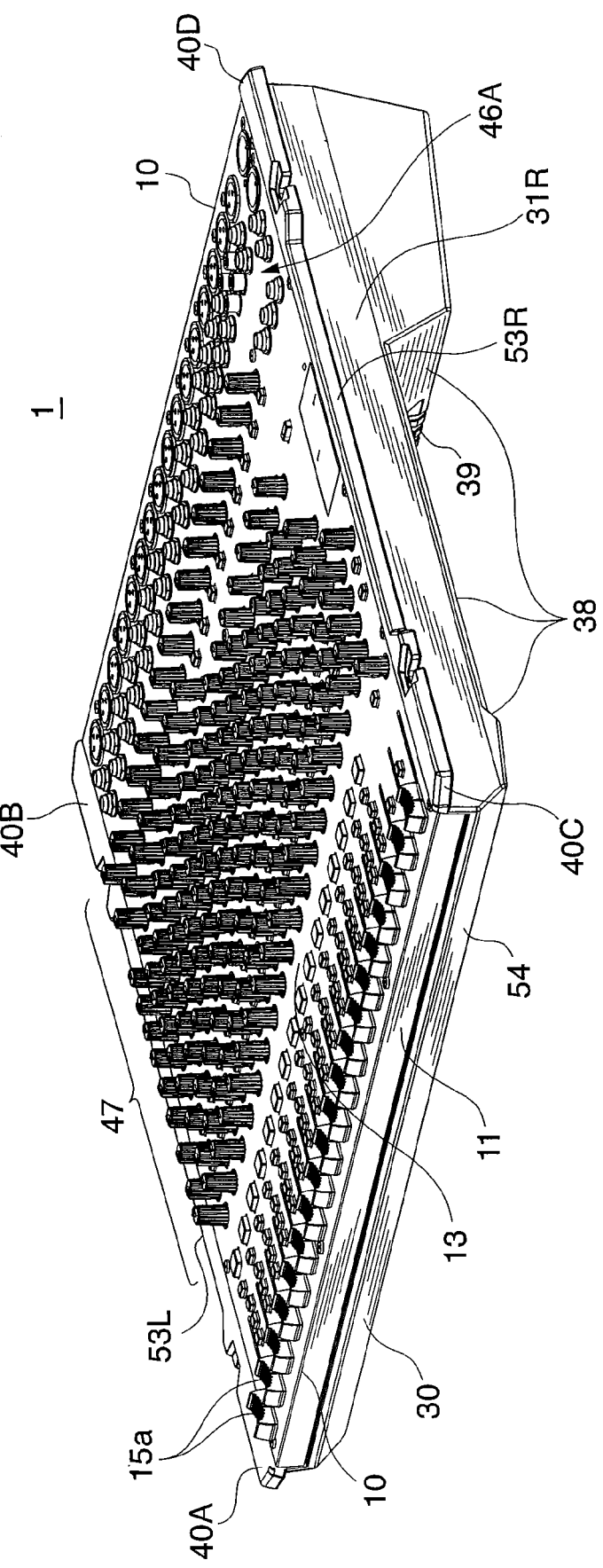

HOUSING STRUCTURE OF ACOUSTIC CONTROLLER

BACKGROUND OF THE INVENTION

1. Field of the Invention

The present invention relates to a housing structure of an acoustic controller, and more particularly, to a housing structure of an acoustic controller that makes the controller usable both in a stationarily placed state and in a rack-mounted state.

2. Description of the Related Art

Conventionally, there has been known an acoustic controller such as a mixer apparatus that can be used both in a state where the controller is stationarily placed and in a state where it is rack-mounted (see, Japanese Laid-open Patent Publication No. 2004-111657). Such an acoustic controller includes a housing having side surfaces thereof to which angle members for rack-mount installation are detachably attached. When the controller is stationarily placed on a tabletop or the like for stand-alone use, the angle members function to protect stepped portions of the housing. To rack-mount the controller, the angle members are reattached to the housing of the controller in different direction, and the housing is then mounted to a rack via the angle members.

The angle members or other mounting members of the conventional acoustic controller are formed separately from the housing for being fixed thereto by screws. Hence, the controller requires an increased number of component parts. In addition, the mounting members must be reattached to the housing each time to change the controller between tabletop use and rack mount use, thus requiring cumbersome operation.

The housing of the conventional acoustic controller which is generally made of metal is low in the degree of freedom in shape design and difficult to be made lightweight. In the case of the housing being die-molded from synthetic resin to make the housing lightweight, on the other hand, there is a fear that due to shrinkage of the molded housing or the like, left and right side walls of the housing are deformed such as being inclined inward or undulated in a front-to-rear direction thereof.

SUMMARY OF THE INVENTION

The present invention provides a housing structure of an acoustic controller having a lower case thereof which is lightweight and high in the degree of freedom in shape design and whose side walls are suppressed from being deformed after being molded.

The present invention also provides a housing structure of an acoustic controller having a lower case thereof which is lightweight and high in the degree of freedom in shape design and capable of reducing the number of component parts and making a mounting operation easy.

According to one aspect of this invention, there is provided a housing structure of an acoustic controller comprising a housing comprised of a lower case and an upper unit having its operation panel surface, the acoustic controller being adapted to be usable both in a stationarily placed state and in a rack-mounted state, wherein the lower case is integrally formed by a resin, has at least left and right walls, and has an open part thereof which is positioned upward when the acoustic controller is in the stationarily placed state, the upper unit of the housing is adapted to be mounted to the open part of the lower case, and the left and right walls of the lower case are provided with left and right flanges extending in a front-to-rear direction of the housing and projecting outward in a left-to-right direction of the housing.

According to this housing structure, the lower case can be made lightweight and the degree of freedom in shape design of the lower case can be increased, and the side walls of the lower case can be suppressed from being deformed after having been molded.

In the present invention, the left and right flanges of the left and right walls of the lower case also function as mounting portions used for mounting the housing to a rack.

In this case, the number of component parts of the housing can be reduced and an operation of mounting the housing to the rack can be carried out with ease.

According to a second aspect of this invention, there is provided a housing structure of an acoustic controller comprising a housing comprised of a lower case and an upper unit having its operation panel surface, the acoustic controller being adapted to be usable both in a stationarily placed state and in a rack-mounted state, wherein the lower case is integrally formed by a resin, has at least left and right walls, and has an open part thereof which is positioned upward when the acoustic controller is in the stationarily placed state, the upper unit of the housing is adapted to be mounted to the open part of the lower case, and mounting portions used for mounting the housing to a rack are integrally formed on an outer left side of the left wall and an outer right side of the right wall of the lower case, respectively.

With this housing structure, the lower case can be made lightweight and the degree of freedom in shape design can be increase, the number of component parts of the housing can be reduced, and an operation of mounting the housing to the rack can be carried out with ease.

Further features of the present invention will become apparent from the following description of an exemplary embodiment with reference to the attached drawings.

BRIEF DESCRIPTION OF THE DRAWINGS

FIG. 2A is a perspective view of the acoustic controller as seen from obliquely above;

DETAILED DESCRIPTION OF THE PREFERRED EMBODIMENT

The present invention will now be described in detail below with reference to the drawings showing a preferred embodiment thereof.

Figure 1A:
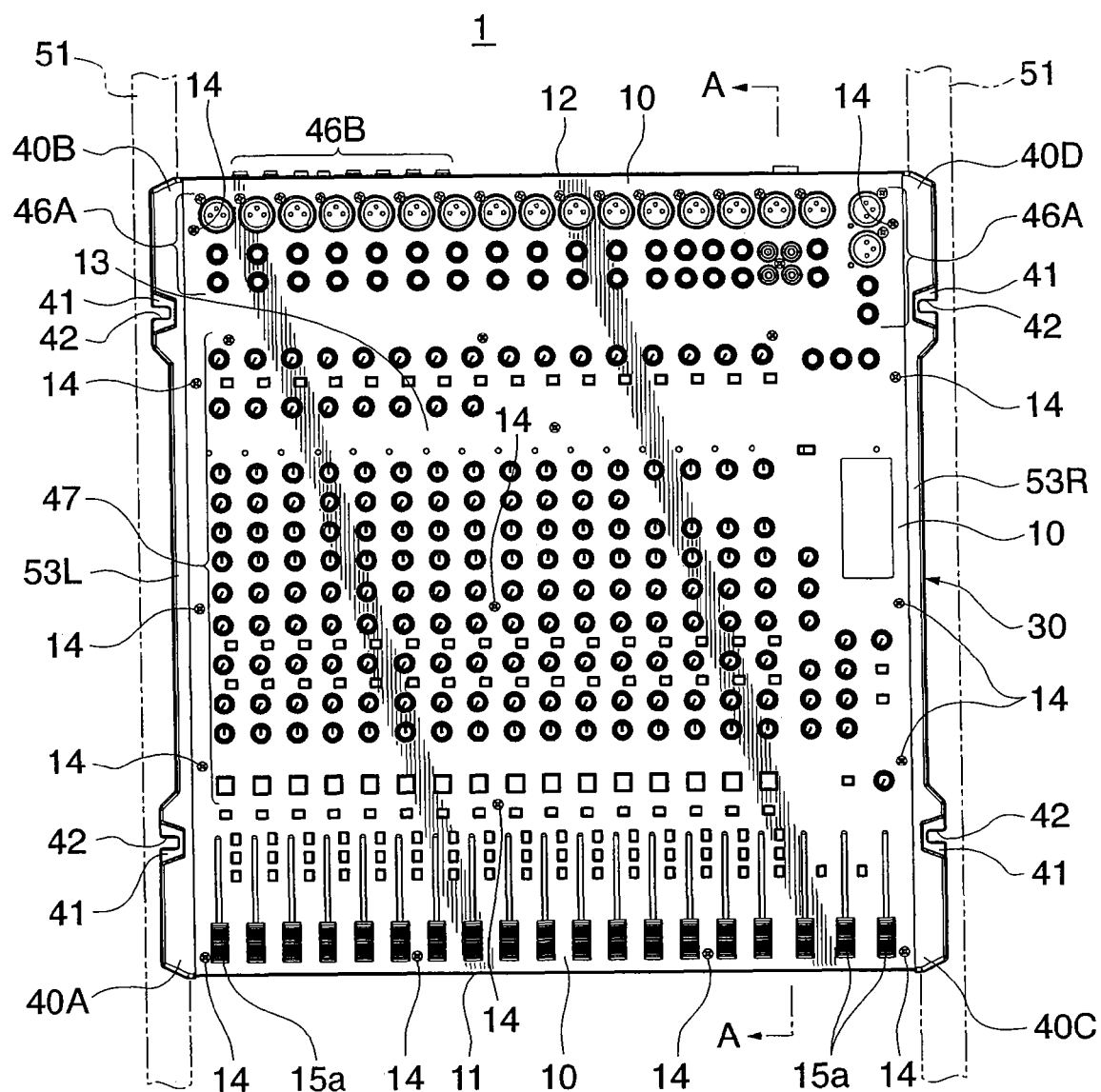
FIG. 1A is a plan view showing an acoustic controller to which a housing structure according to one embodiment of this invention is applied.
Figure 1B:
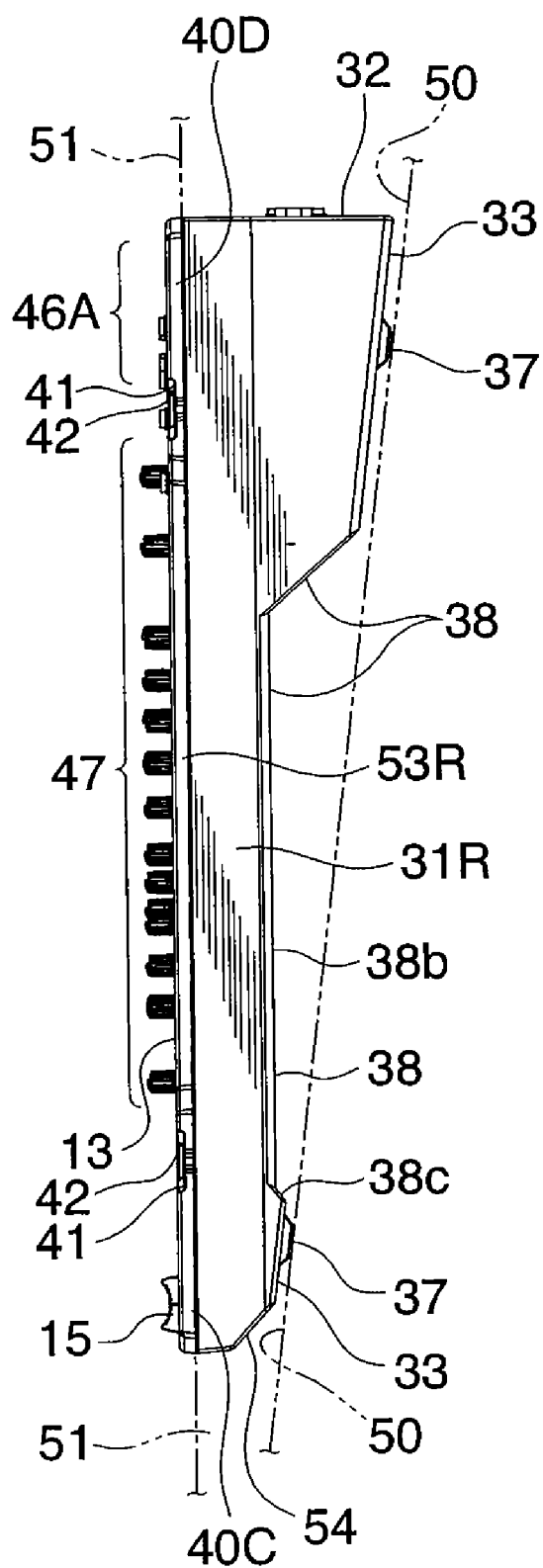
FIG. 1B is a right side view of the acoustic controller.

FIGS. 1A and 1B respectively show in plan view and right side view an acoustic controller to which a housing structure according to one embodiment of this invention is applied. The acoustic controller 1 is configured as a so-called mixer apparatus, and includes a housing comprised of an upper unit 10 and a lower case 30, which are adapted to be assembled together.

The acoustic controller 1 is configured to be usable in either state of being placed on a floor or a tabletop (hereinafter referred to as "in stationary use") or being mounted to a rack 51 (hereinafter referred to as "in rack mount use").

In the following, unless otherwise specified, the vertical direction of the acoustic controller 1 is determined under an assumption that the controller is in stationary use although the direction of the controller is different between when the controller is in stationary use and in rack mount use. In stationary use, a user is on the side of a front surface 11 of the upper unit 10, which is a part of a front portion of the controller 1. In the following, a front surface 11 side of the upper unit 10 will be referred to as the "front side" of the controller 1, whereas a rear surface 12 side of the upper unit 10, which is a part of a rear portion of the controller, will be referred to as the "rear side" of the controller unless otherwise specified.

The acoustic controller 1 has an operation panel surface 13 on its upper side and has a plurality of legs 37 on its lower side. As shown in FIG. 1B, when the controller 1 is in stationary use, the legs 37 are made in contact with a tabletop surface 50, and a bottom plate 33 is disposed to face the table top surface 50. The controller 1 is made higher (thicker) toward a rear portion thereof. When the controller 1 is in stationary use, the operation panel surface 13 is inclined downward toward a front portion thereof for ease of user operation. It is assumed that a rack 51 is installed vertically. In that case, the operation panel surface 13 of the rack-mounted acoustic controller 1 extends vertically in a facing relation with the user. The angle of installation of the rack 51 is shown by way of example in FIGS. 1A and 1B. The rack 51 can be installed at any angle so long as the operation panel surface 13 is disposed in a direction suitable for easy user operation when the controller 1 is in rack mount use.

Figure 2B:
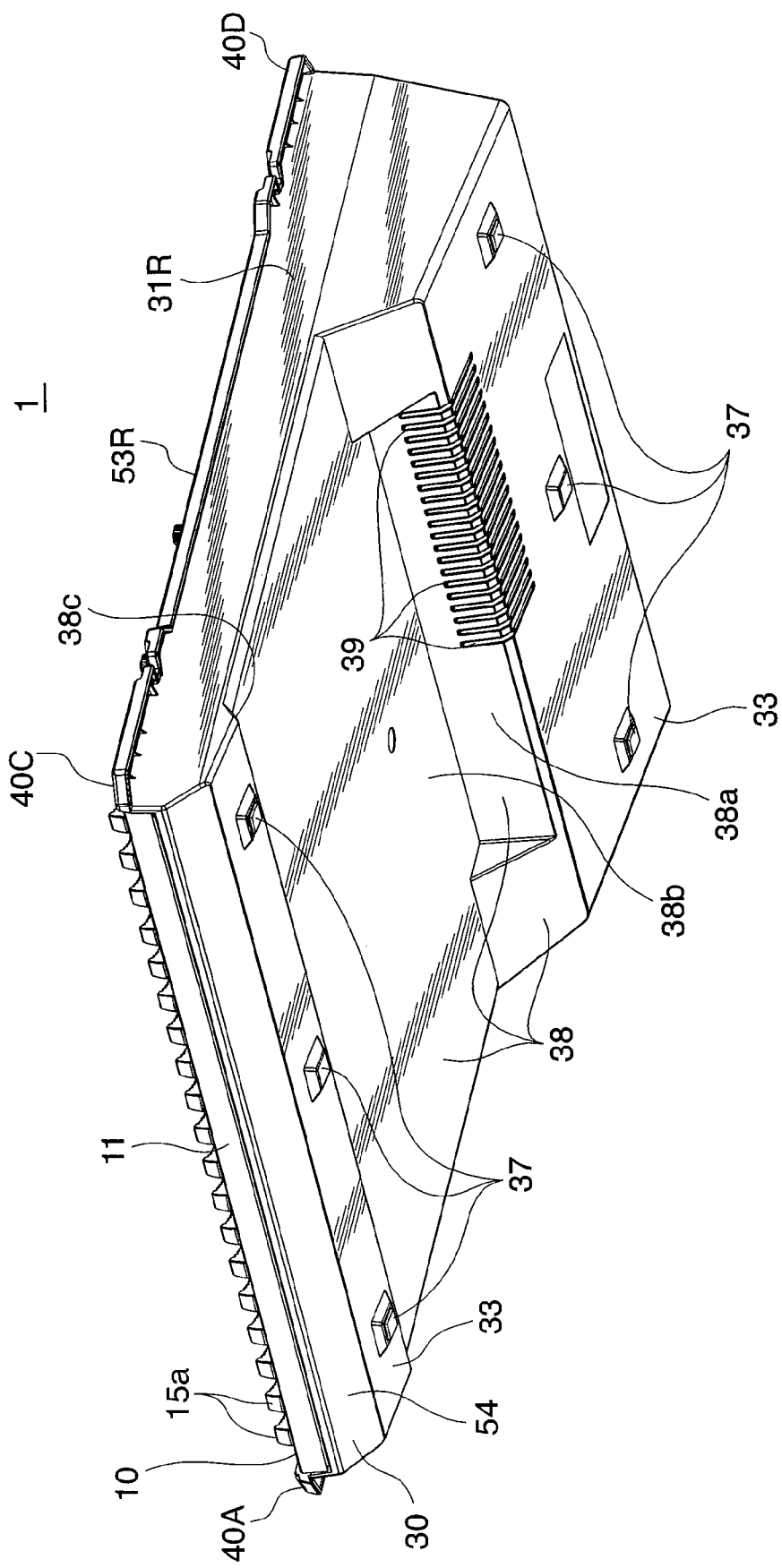
FIG. 2B is a perspective view of the acoustic controller as seen from obliquely below.
Figure 3:
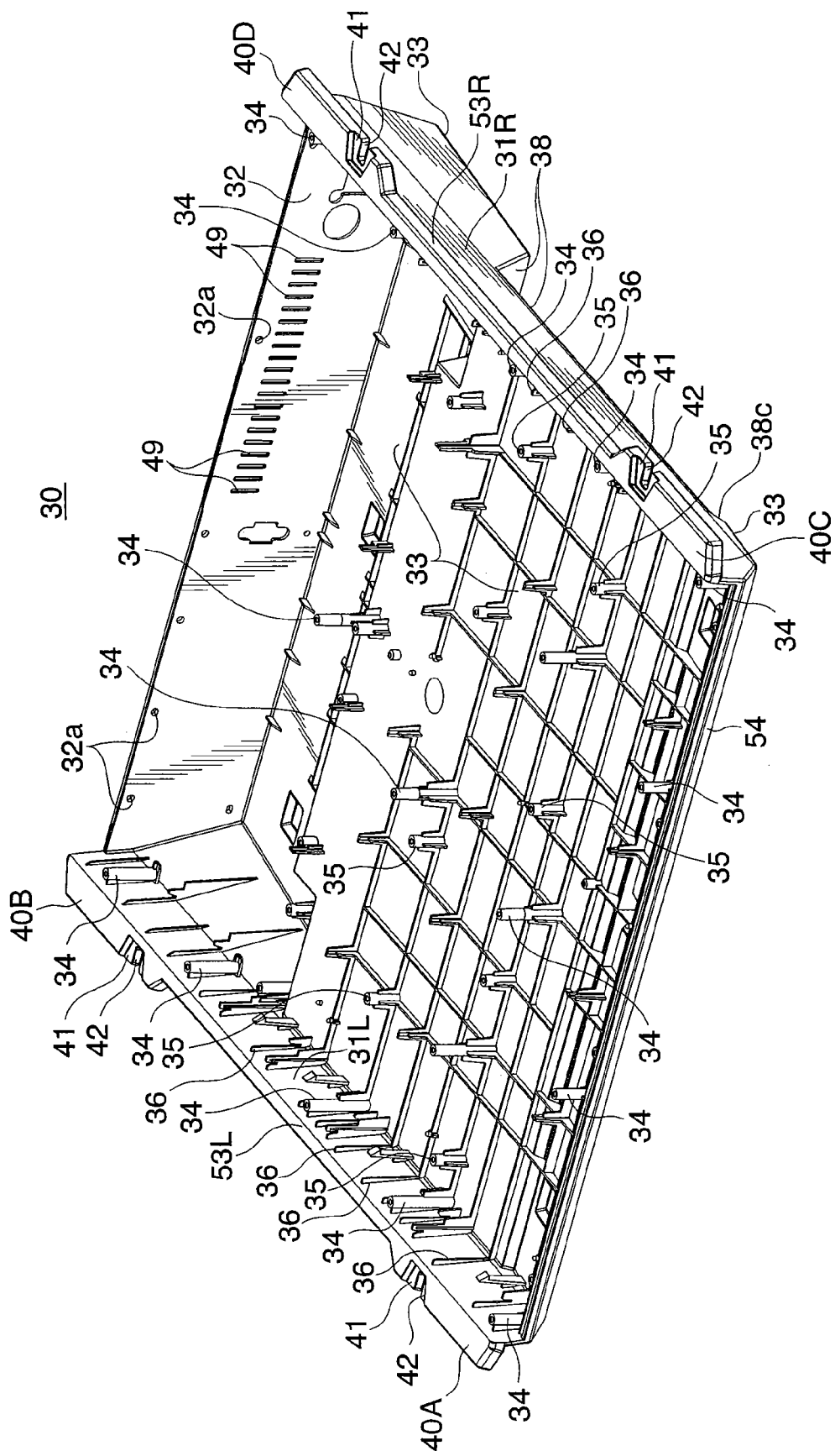
FIG. 3 is a perspective view of a lower case as seen from obliquely above.
Figure 4A:
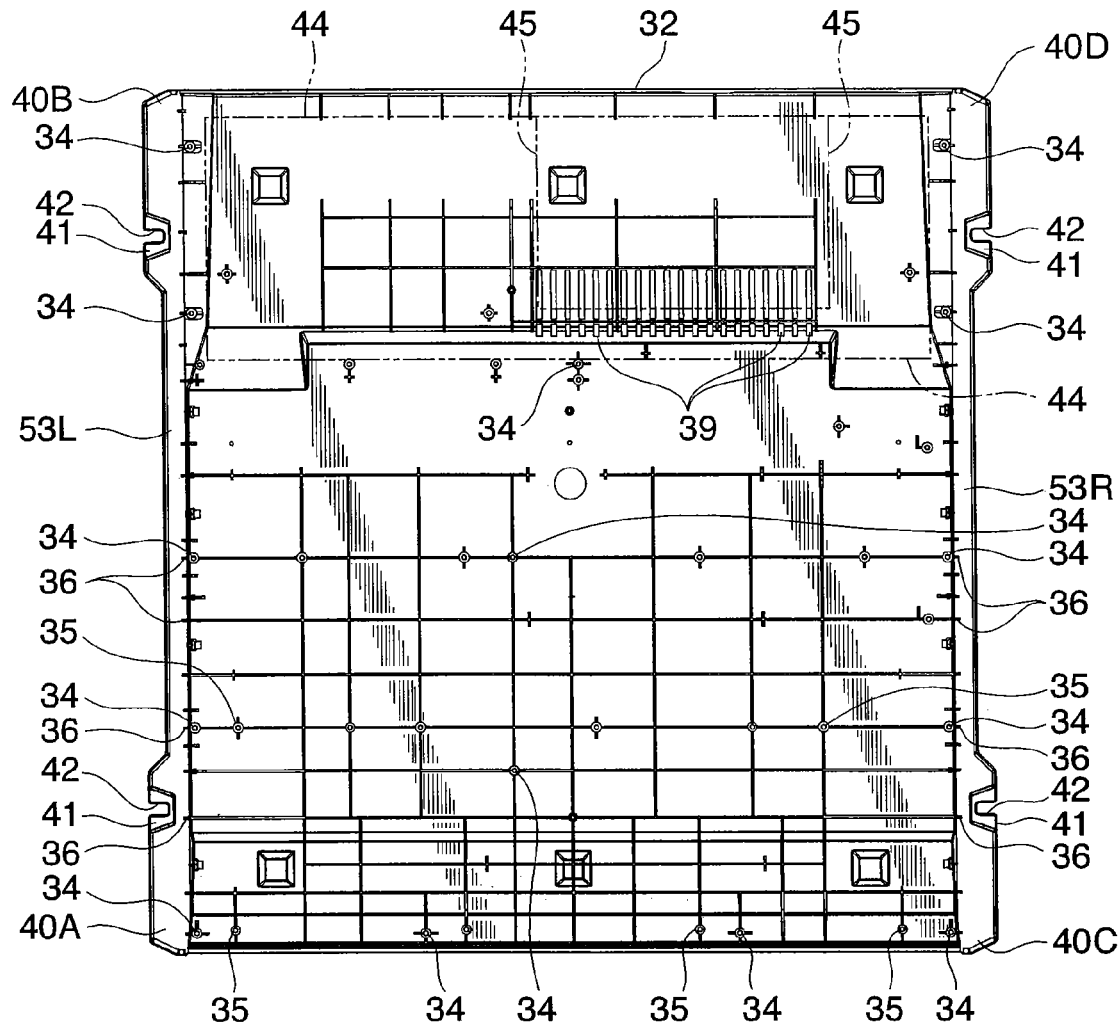
FIG. 4A is a plan view of the lower case.
Figure 4B:
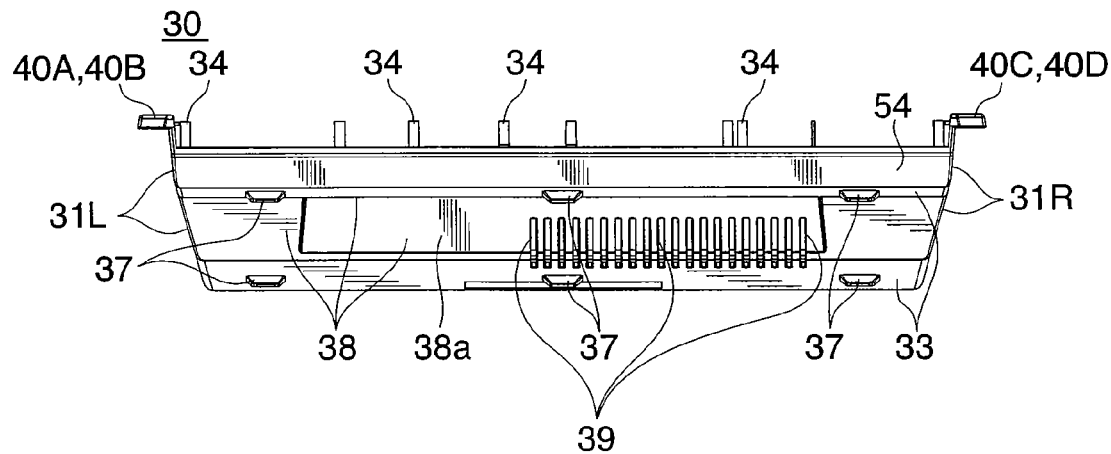
FIG. 4B is a front view of the lower case.
Figure 5A:
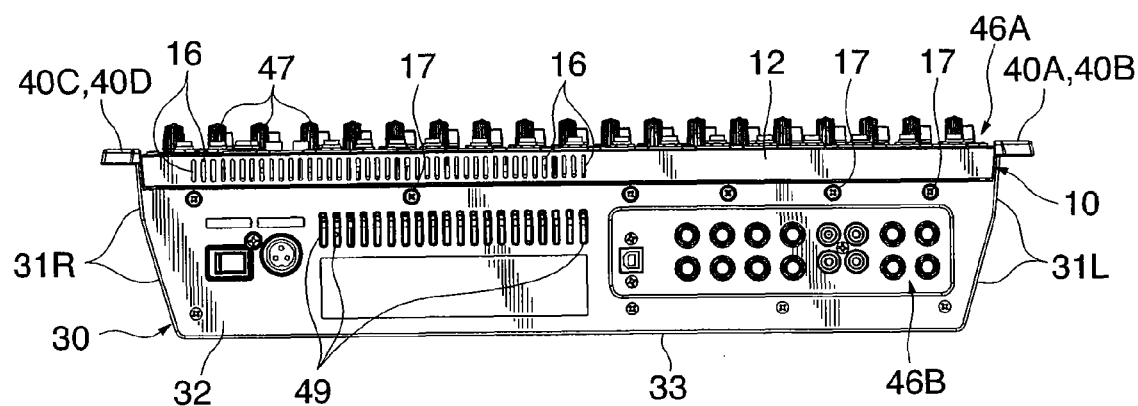
FIG. 5A is a rear view of the acoustic controller.
Figure 5B:
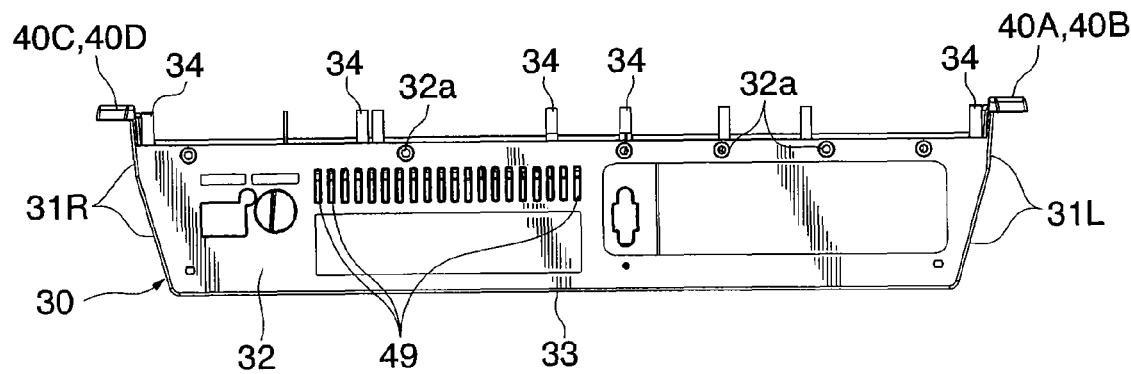
FIG. 5B is a rear view of the lower case.
Figure 6:
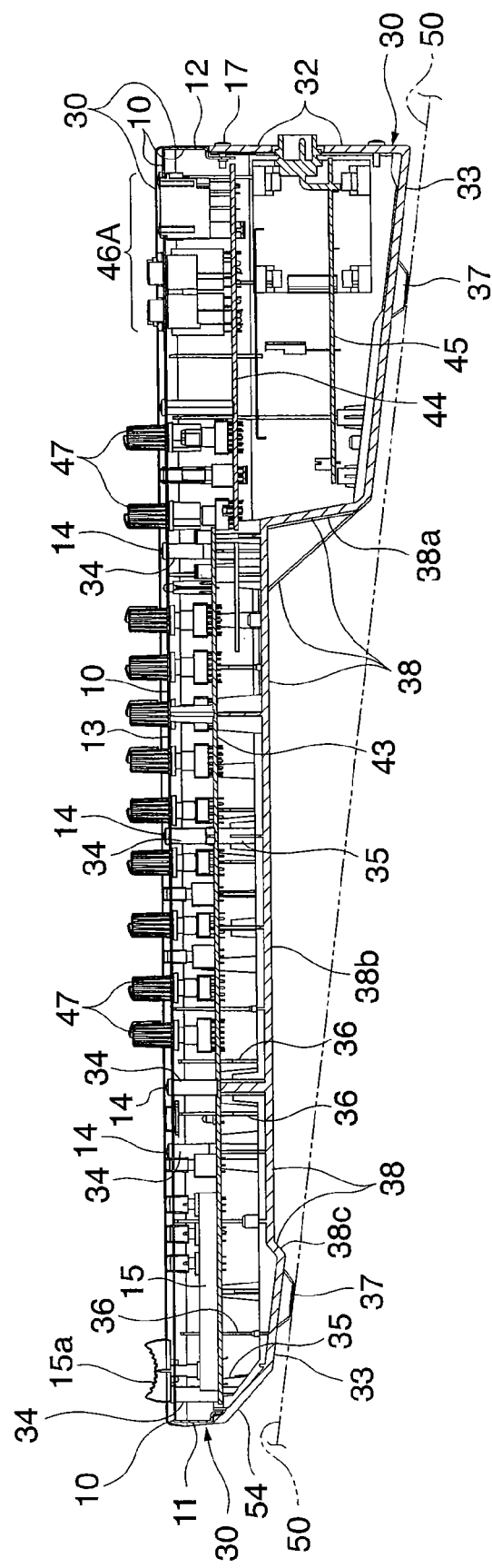
FIG. 6 is a section view taken along line A-A shown in FIG. 1A.

FIGS. 2A and 2B show the acoustic controller 1 in perspective view, FIG. 3 shows the lower case 30 in perspective view, FIGS. 4A and 4B show the lower case 30 in plan view and front view, FIGS. 5A and 5B show the acoustic controller 1 and the lower case 30 in rear view, and FIG. 6 is a section view taken along line A-A. In a strict sense, FIG. 4B shows the front surface of the lower case 30 and FIGS. 5A and 5B show the rear surfaces of the controller 1 and the lower case 30 in a state where the operation panel surface 13 is disposed horizontally.

The upper unit 10 is made of metal such as a sheet metal or aluminum, and is formed into a shallow inverted U-shape as seen in side view of FIG. 6. The upper unit 10 has a horizontal upper surface that constitutes the operation panel surface 13 whose front and rear portions are bent downward and constitute the front and rear surfaces 11, 12 of the upper unit 10 (see, FIGS. 1A, 2A, 2B, 5A, and 6). Since being formed into inverted U-shape, the upper unit 10 is high in bending stiffness in the left-to-right direction thereof. The upper unit 10 is formed at its rear surface 12 with heat radiation slits 16 (see FIG. 5A). The operation panel surface 13 is formed with holes to which screws 14 are screwed into the lower case 30 as described later, and is formed with holes through which operator groups 47, input/output units 46A, etc. are exposed (see FIG. 6).

As shown in FIGS. 3 to 5B, the lower case 30 includes a front plate 54, a rear plate 32, a left plate 31L, a right plate 31R, and a bottom plate 33, and is formed into a rectangular dish shape as viewed in plan. The lower case 30 has an open upper surface thereof to which the upper unit 10 is attached. The lower case 30 is integrally die-molded from a synthetic resin. The front surface 11 of the upper unit 10 cooperates with the front plate 54 of the lower case 30 to form a front portion of the acoustic controller 1, whereas the rear surface 12 cooperates with the rear plate 32 to form a rear portion of the controller 1. It is not inevitably necessary that each of the front and rear portions of the controller 1 is constructed by corresponding parts of the upper unit 10 and the lower case 30.

The left and right plates 31L, 31R of the lower case 30 extend slightly beyond the front and rear plates 54, 32 of the lower case 30, as viewed in the vertical direction. Upper portions of the left and right plates 31L, 31R are formed into brim portions 53L, 53R extending in the front-to-rear direction of the lower case 30 and protruded outward in the left-to-right direction thereof. The brim portions 53L, 53R of the lower case 30 extend horizontally. Front and rear portions of the brim portion 53L are further protruded leftward and formed into flanges 40A, 40B of the lower case 30. Similarly, front and rear portions of the brim portion 53R are further protruded rightward to be formed into flanges 40C, 40D.

Each of the flanges 40A to 40D is formed with a mounting portion 41 and a notched portion 42. Since the brim portions 53L, 53R are formed horizontally over the entire length of the lower case 30 in the front-to-rear direction, the left and right plates 31L, 31R are suppressed from being deformed such as being inwardly inclined or being undulated after the molding of the lower case 30. Moreover, the bending stiffness of the left and right plates 31L, 31R in the front-to-rear direction can be increased, whereby the rigidity of the lower case 30 in the front-to-rear direction can also be increased. The flanges 40A to 40D function as mounting portions that are used for rack mounting the acoustic controller 1. The completed acoustic controller 1 is mounted to the rack 51 by being fixed at the mounting portions 41 of the lower case 30 to the rack 51 using screws (not shown) which are inserted though the notched portions 42 of the lower case 30 (see FIG. 1A).

As shown in FIG. 2B, the bottom plate 33 of the lower case 30 has its intermediate portion 38 which is convex upward and extends from near a front end of the bottom plate 33 to mid-part of a rear half thereof, as viewed in the front-to-rear direction of the lower case 30. The intermediate portion 38 of the bottom plate 33, i.e., a concave-forming portion, is convex upward and defines a concave that is defined over the entire width of the lower case 30 in the left-to-right direction thereof and in communication with the outside of the acoustic controller 1 on the left and right sides thereof in a state where the controller 1 is stationarily placed (see FIG. 1B). The concave-forming portion 38 has an inclined front part 38c, an inclined rear part 38a extending nearly vertically, and a horizontal part 38b extending between upper ends of the inclined parts 38a, 38c, and is formed into a shallow inverted U-shape, as seen from side (see FIG. 6). The horizontal part 38b of the lower case 30 extends parallel to the brim portions 53L, 53R of the lower case 30. The upper unit 10 has its thickness becoming smaller toward the front portion thereof, the thickness being a distance between the horizontal part 38b and the operation panel surface 13. Due to the provision of the inverted U-shaped concave-forming portion 38 in the lower case 30, the rigidity of the lower case 30 increases mainly in the left-to-right direction thereof. Heat radiation slits 39 are formed in the inclined part 38a of the bottom plate 33 and formed in that part of the bottom plate 33 which is adjacent to the inclined part 38a (see FIGS. 2B, 4A and 4B).

As shown in FIGS. 3 and 5B, fastening holes 32a are formed in upper part of the rear plate 32 of the lower case 30, and heat radiation slits 49 are formed in an upper right part of the rear plate 32.

As shown in FIGS. 3 to 5B, the bottom plate 33 of the lower case 30 has its upper surface formed with thickened portions such as reinforcing ribs and bosses to which component parts are mounted. For example, bosses 34 used for mounting the upper unit 10 are formed in those portions of the bottom plate 33 which are adjacent to the left and right plates 31L, 31R and formed in front and intermediate portions of the bottom plate 33. Furthermore, bosses 35 used for mounting an operator board 43 (see FIG. 6), described later, etc. are formed in appropriate places of the bottom plate 33. Specifically, the bosses 34, 35 and vertical ribs 36 are provided to project upward from the horizontal part 38b of the bottom plate 33.

In the bottom plate 33, a plurality of ribs such as, for example, the vertical ribs 36, are formed adjacent to the left and right plates 31L, 31R. The bosses 34 and the vertical ribs 36 extend to the same vertical level as that of the brim portions 53L, 53R (see FIGS. 5B and 6).

As shown in FIG. 6, the lower case 30 is assembled to the upper unit 10, with lower parts of the front and rear surfaces 11, 12 of the upper unit 10 fitted to upper parts of the front and rear plates 54, 32 of the lower case 30. Specifically, the rear plate 32 is fixed to the rear surface 12 from rear using screws 17 inserted through the fastening holes 32a, and screws 14 (see FIG. 1A) are inserted through holes formed in the operation panel surface 13 of the upper unit 10 and then threadedly engaged from above with the bosses 34 of the lower case 30 (see FIGS. 3 and 4B), whereby the housing is constructed.

A power supply board 45 is disposed at that part of the lower case 30 which is located rearward of the concave-forming portion 38, and an input/output terminal board 44 is disposed above the power supply board 45 (see FIGS. 4A, 4B, and 6). These boards 44, 45 are disposed horizontally relative to the operation panel surface 13 and fixed to the lower case 30 by screws or snap fittings. Input/output units 46A, 46B including various terminals, etc. are disposed on and connected to the input/output terminal board 44. The input/output units 46A are exposed upward in a rear part of the operation panel surface 13 of the upper unit 10 (see FIG. 1A), and the input/output unit 46B is disposed to be exposed toward the rear surface of the left half of the rear plate 32 of the lower case 30 (see FIG. 5A).

The input/output terminal board 44 and the power supply board 45, which are heat generating component parts acting as a main heat source in the housing, are located between the heat radiation slits 39 (see FIGS. 2A, 2B, 4A and 4B) and the heat radiation slits 16, 49 (see FIGS. 3 and 5) as viewed in the front-to-rear direction and located close to the heat radiation slits 39, 16, and 49. Thus, the efficiency of heat radiation from the heat radiation slits 39, 16, and 49 are large, whereby the boards 44, 45 are effectively cooled. Furthermore, when the acoustic controller 1 is in a rack-mounted state in particular, the heat radiation slits 30 are located below the boards 44, 45 and the heat radiation slits 16, 49 are located above the boards. Therefore, cool air enters from the heat radiation slits 39, and air having been used for cooling the boards 44, 45 flows through the heat radiation slits 16, 49 upward. As a result, a smooth air flow is naturally generated whereby the cooling effect is enhanced.

As shown in FIG. 6, the operator board 43 is horizontally fixed to the boss 35 on the horizontal part 38b of the concave-forming portion 38 of the lower case 30 using screws (see FIGS. 3 and 4). On the operator board 43, there are disposed various operator groups 47, which are exposed upward in the operation panel surface 13 of the upper unit 10 (see FIG. 1A). The operator groups 47 include function setting component parts and function display component parts (switches, rotary volumes, LEDs, liquid crystal display devices, etc) of the mixer apparatus. Fader units 15 are disposed on a front part of the operator board 43. Each of the fader units 15 has a fader operator part thereof which is exposed through the operation panel surface 13 and to which a knob 15a is fitted (see FIGS. 1A, 1B, 2A, 2B, etc.). The boards 43, 44, and 45 are electrically connected to one another by bundle wires, not shown. The operator groups 47 can be fixedly disposed on the upper unit 10, not on the lower case 30.

In the fabrication of the acoustic controller 1, the boards 43 to 45 and interior component parts are first disposed in the lower case 30. Then, the upper unit 10 is mounted and threadedly fixed to the open upper part of the lower case 30. Finally, the knobs 15a are attached to the fader units 15.

According to the present embodiment including the lower case 30 made of resin, it is easy to reduce the weight of the lower case 30 and freely design its shape. Specifically, it is easy to add reinforcements to the resin lower case 30 and remove undesired parts thereof for weight reduction, unlike a lower case made of metal and low in the degree of freedom of formation, which is not easy to be added with reinforcements and to have undesired parts thereof removed. With this embodiment, therefore, the acoustic controller 1 can be designed to be suitable even when it is in stationary use. Nevertheless, it can be ensured that the resin lower case 30 has high rigidity by the inverted U-shaped concave-forming portion 38 formed in the bottom plate 33.

The resin lower case 30 is integrally formed with thickened portions such as bosses and ribs. Especially, bosses 34, 35, vertical ribs 36 and other thickened portions are formed in the horizontal part 38b of the concave-forming portion 38 of the bottom plate 33. Height sizes of these thickened portions can be made smaller, as compared to a case where the concave-forming portion 38 is not provided, since the horizontal part 38b of the concave-forming portion 38 is disposed at a vertical position higher than vertical positions of front and rear parts of the bottom plate 33. The provision of the concave-forming portion 38 not only contributes to reduction in thickness and increase in rigidity of the acoustic controller 1, but also to prevent the height sizes of thickened portions of the lower case 30 from increasing, whereby formability of the lower case 30 can be improved.

Since heat radiation slits 39 are formed in the concave-forming portion 38 of the bottom plate 33, there can be increased a distance between the tabletop surface 50 and the heat radiation slits 39 when the acoustic controller 1 is stationarily placed on the tabletop surface 50. In addition, since a concave space defined by the concave-forming portion 38 is in communication with the outside of the controller 1 on the left and right sides thereof when the controller is stationarily placed, there can be attained smooth air conduction between inside and outside of the housing. Thus, it is ensured that the heating generating component parts disposed inside the housing, especially, such as the input/output terminal board 44 and the power supply board 45 disposed near the heat radiation slits 39 (see FIG. 6), can be sufficiently cooled when the controller is stationarily placed. When the acoustic controller 1 is rack-mounted, the heat radiation slits 16, 49 and the heat radiation slits 39 are disposed in a vertical positional relation to each other whereby a cooling air flow is generated. As a result, an inner rear part of the housing, especially, heat generating component parts such as boards 44, 45 can effectively be cooled when the acoustic controller 1 is rack-mounted.

Furthermore, in this embodiment, the brim portions 53L, 53R are projectedly provided in the left and right plates 31L, 31R of the lower case 30 in the front-to-rear direction so as to project outward as viewed in the left-to-right direction when the controller is stationarily placed (see FIG. 3). As a result, after being molded from resin, the left and right plates 31L, 31R are suppressed from being deformed such as being inwardly inclined and/or being undulated in the front-to-rear direction.

In addition, the brim portions 53L, 53R are formed integrally with the lower case 30, and their flanges 40A to 40D having mounting portions 41 (see FIGS. 3 and 4A) also function as rack mount portions. As a result, the number of component parts of the controller 1 can be decreased, and the controller can be simplified in construction, making it possible to reduce costs. Moreover, it is unnecessary to perform operations such as reattaching the flanges 40A to 40D to the housing, even if the controller is changed between stationary use and rack mount use, making it easy to carry out mounting operation.

The brim portions 53L, 53R increase the rigidity of the resin lower case 30, and therefore, it is easy to decrease the height and width of the ribs formed in the lower case 30 used for suppressing the lower case from being deformed and improving the rigidity thereof, making it possible to effectively utilize the internal volume of the lower case 30.

In the above described embodiment, the input/output terminal board 44 and the power supply board 45 are shown by way of example, as heat generating component parts (see FIG. 6), but heat generating component parts to be cooled are not limited thereto. Furthermore, the heat generating component parts are not limited to be disposed in the lowercase 30, but can be disposed in the upper unit 10 as long as they are disposed inside the housing.

In the embodiment, the heat radiation slits 39 and the heat radiation slits 16, 49 are disposed in longitudinal positional relation, with the boards 44, 45 interposed therebetween, but the positional relation therebetween is not limited thereto. These slits can be disposed in a lateral or oblique relation. Specifically, in the above described embodiment, the heat generating component parts are disposed mainly in the rear part of the housing, and the heat radiation slits 16, 49 are also formed in the rear part thereof. In a case where the heat generating component parts are located in a front part of the housing, heat radiation slits can be provided on the front part thereof. Heat radiation slits disposed on the side opposite from the heat radiation slits 39 between which heat generating component parts are interposed can be formed in either the upper unit 10 or the lower case 30. By way of example, in the above described embodiment, either heat radiation slits 16 or 49 can be provided on the side opposite from the heat radiation slits 39.

As far as from the viewpoint of decreasing the number of component parts and improving the ease of mounting operation, instead of the flanges 40A to 40D, mounting portions not formed into a flange shape can be integrally formed in the lower case 30.

In the above described embodiment, as thickened portions of the lower case 30 whose height sizes are to be suppressed from increasing to improve the formability of the lower case 30, bosses 34, 35 and vertical ribs 36 are shown by way of example, but they are not limitative. The formability of the lower case 30 can advantageously be improved by suppressing the height sizes of any thickened portions that are integrally formed in the horizontal part 38b of the concave-forming portion 38 of the lower case 30.

What is claimed is:

1. A housing structure of an acoustic controller, comprising:
   a housing comprised of a lower case and an upper unit having its operation panel surface, the acoustic controller being adapted to be usable both in a stationarily placed state and in a rack-mounted state,
   wherein the lower case is integrally formed by a resin, has at least left and right walls, and has an open part thereof which is positioned upward when the acoustic controller is in the stationarily placed state,
   the upper unit of said housing is adapted to be mounted to the open part of the lower case, and
   the left wall of the lower case has, at an upper portion thereof, a left flange extending in a front-to-rear direction of said housing and projecting outward in a left direction of said housing, and the right wall of the lower case has, at an upper portion thereof, a right flange extending in the front-to-rear direction of said housing and projecting outward in a right direction of said housing.

2. The housing structure of an acoustic controller according to claim 1, wherein the left and right flanges of the left and right walls of the lower case also function as mounting portions used for mounting said housing to a rack.

3. A housing structure of an acoustic controller, comprising:
   a housing comprised of a lower case and an upper unit having its operation panel surface, the acoustic controller being adapted to be usable both in a stationarily placed state and in a rack-mounted state,
   wherein the lower case is integrally formed by a resin, has at least left and right walls, and has an open part thereof which is positioned upward when the acoustic controller is in the stationarily placed state,
   the upper unit of said housing is adapted to be mounted to the open part of the lower case, and
   mounting portions used for mounting said housing to a rack are integrally formed on a left side of the left wall projecting outward at an upper portion thereof, and integrally formed on a right side of the right wall projecting outward at an upper portion thereof.

4. A housing structure of an acoustic controller, comprising:
   a housing comprised of a lower case and an upper unit having its operation panel surface, the acoustic controller being adapted to be usable both in a stationarily placed state and in a rack-mounted state,
   wherein the lower case is integrally formed by a resin, has at least left and right walls, and has an open part thereof which is positioned upward when the acoustic controller is in the stationarily placed state,
   the upper unit of said housing is adapted to be mounted to the open part of the lower case, and
   the left wall of the lower case has, at an upper portion thereof, a left brim portion extending in a front-to-rear direction of said housing and projecting outward in a left direction of said housing, and the right wall of the lower case has, at an upper portion thereof, a right brim portion extending in the front-to-rear direction of said housing and projecting outward in a right direction of said housing, and
   front and rear portions of the left brim portion further project outward in the left direction of said housing, and front and rear portions of the right brim portion further project outward in the right direction of said housing.

5. The housing structure of an acoustic controller according to claim 4, wherein the left and right brim portions of the left and right walls of the lower case also function as mounting portions used for mounting said housing to a rack.

6. A housing structure of an acoustic controller, comprising:

a housing comprised of a lower case and an upper unit having its operation panel surface, the acoustic controller being adapted to be usable both in a stationarily placed state and in a rack-mounted state, wherein the lower case is integrally formed by a resin, has at least left and right walls, and has an open part thereof which is positioned upward when the acoustic controller is in the stationarily placed state, the upper unit of said housing is adapted to be mounted to the open part of the lower case, and left mounting portions used for mounting said housing to a rack are integrally formed on a left side of the left wall projecting outward at an upper portion thereof, and right mounting portions used for mounting said housing to the rack are integrally formed on a right side of the right wall projecting outward at an upper portion thereof, and each of the left mounting portions has a left recessed portion and a left notched portion formed at the left recessed portion, and each of the right mounting portions has a right recessed portion and a right notched portion formed at the right recessed portion.

* * * * *